United States Patent
Cooper et al.

(10) Patent No.: US 7,456,105 B1
(45) Date of Patent: Nov. 25, 2008

(54) CMP METAL POLISHING SLURRY AND PROCESS WITH REDUCED SOLIDS CONCENTRATION

(75) Inventors: Kevin Elliot Cooper, La Terrasse (FR);
Jennifer Lynn Cooper, La Terrasse (FR); Janos Farkas, Saint Ismier (FR);
John C. Flake, Montbonnot (FR);
Johannes Friedrich Groschopf, Hopewell Junction, NY (US); Yuri Solomentsev, Allen, TX (US)

(73) Assignees: AMD, Inc., Sunnyvale, CA (US);
Motorola, Inc., Schaumberg, IL (US)

( * ) Notice: Subject to any disclaimer, the term of this patent is extended or adjusted under 35 U.S.C. 154(b) by 0 days.

(21) Appl. No.: 10/321,973

(22) Filed: Dec. 17, 2002

(51) Int. Cl.
*H01L 21/302* (2006.01)
*H01L 21/461* (2006.01)

(52) U.S. Cl. ................................. 438/692; 257/E21.214

(58) Field of Classification Search ................. 438/692; 257/E21.214
See application file for complete search history.

(56) References Cited

U.S. PATENT DOCUMENTS

| 4,731,128 A | * | 3/1988 | Casullo | 428/470 |
|---|---|---|---|---|
| 5,700,383 A | | 12/1997 | Feller et al. | |
| 5,786,262 A | * | 7/1998 | Jang et al. | 438/424 |
| 5,866,226 A | * | 2/1999 | Masumura et al. | 428/64.1 |
| 5,958,288 A | * | 9/1999 | Mueller et al. | 252/186.1 |
| 5,985,748 A | | 11/1999 | Watts et al. | |
| 6,083,840 A | * | 7/2000 | Mravic et al. | 438/693 |

* cited by examiner

*Primary Examiner*—W. David Coleman
(74) *Attorney, Agent, or Firm*—Charles E. Graves

(57) ABSTRACT

This disclosure describes a low particle concentration formulation for slurry which is particularly useful in continuous CMP polishing of copper layers during semiconductor wafer manufacture. The slurry is characterized by particle concentrations generally less than 2 wt %, and advantageously less than 1 wt %. In particular embodiments, where the particle concentration is in a range of 50 to 450 PPM, an 8-fold increase in polishing rate over reactive liquid slurries has been realized. Slurries thus formulated also achieve a reduction in defectivity and in the variations in planarity from wafer to wafer during manufacture, by improving the stability of polishing quality. The slurry formulations permit substantial cost savings over traditional 2-component, reactive liquid and fixed/bonded abrasive slurries. In addition the formulations provides an advantageous way during CMP to easily change the selectivity or rate of removal of one film material vs. another. Yet another use is to provide slurry "pulsing" as a means to activate bonded abrasive or fixed abrasive slurry technology.

12 Claims, 15 Drawing Sheets

CMP METAL POLISHING SLURRY AND PROCESS WITH REDUCED SOLIDS CONCENTRATION

TECHNICAL FIELD

This invention relates to chemical mechanical planarization (CMP) processes used in semiconductor fabrication; and more particularly to a CMP process for soft metals including copper, tungsten, gold, nickel, and ferrous metals, which uses a greatly reduced concentration of solid materials in the slurry to achieve more repeatable and uniform material removal at substantially lower cost.

BACKGROUND OF THE INVENTION

CMP is used in semiconductor manufacturing for controlled metal removal and for planarization of layer surfaces within a wafer. In typical CMP processes, a polishing slurry is directed onto a rotating polishing pad. A rotating polishing head holding the wafer is moved across the polishing pad. As the process proceeds, the chemical content of the slurry and the mechanical movement of the pad combine to "polish" the wafer surface. Particles suspended in some slurries add to material removal rate. CMP is intended to remove material to isolate interconnects, reduce surface topography and render the surface planar with respect to other surfaces embedded in the wafer.

The three most widely used types of CMP polishing slurries currently are: an abrasive-containing slurry; a reactive liquid abrasive-less (RL) slurry; and a pad containing particle solutions used in fixed abrasive ("FA") and bonded abrasive ("BA") technologies. Two-component slurries consist of a particulate material and a chemical compound, with the particulate material constituting from about 2% to 20% by weight of the total slurry. RL slurries contain no abrasive solid or particulate matter, and hence rely on chemical reaction of the slurry for polishing action. In the third type of CMP, the particles in the pad interact with a chemical solution and the wafer to release the particles from the pad at the point of use.

Because each process type has drawbacks, much work has been directed to developing advanced solutions to improve the CMP process and particularly for copper. The success criteria for an advanced CMP slurry designed for low dielectric constant copper technology are extremely demanding. The success criteria relate to: residual metal, planarity, defectivity, manufacturability/compatibility, and electrical yield. All criteria summarized below must be met for any new CMP chemistry to compete with the traditional CMP chemistries employed in semiconductor manufacture.

"Residual" refers to the amount of material, for example metal, remaining on undesired areas such as dielectric between metal lines, after a CMP polishing or "clearing" step is completed. Ideally, no unwanted metal is left. The primary purpose of copper CMP is to isolate metal lines by polishing the wafer back to the dielectric interface. Traditional solid-based slurries accomplish this by polishing until the interface with the next material is exposed; and then continuing the polishing for some additional time. This additional polish, called "overpolish" is needed to compensate for non-uniform film removal across the wafer during CMP, or non-uniform film thickness on the wafer prior to the CMP step. For a typical multilayer integrated circuit, a whole range of features need to be cleared, from very large isolated features to very dense minimum pitch arrays. Typically, dense minimum pitch features are the last to clear, both because they plate more thickly and polish more slowly. RL slurries have shown limitations in their ability to clear dense minimum pitch features. In addition, as integrated circuits build vertically into multi-layer circuit builds (MLBs), lower level topography creates enormous challenges for polishing at higher levels because of the additive effect of topography from one level to the next. RL solutions are not well-adapted to the unique polishing problems associated MLBs.

"Planarity" refers to minimizing dishing and erosion topographies arising in a CMP process which detract from achieving uniform and planar metal and dielectric surfaces throughout the wafer. Whatever a particular CMP chemistry's effectivity may be in achieving desired residual criteria, it must also avoid creating excessive dishing and erosion.

"Defectivity" refers to any surface abnormality including mechanically caused defects such as scratching, gouging, and general roughness of surfaces arising during CMP. The mechanical defects are usually caused by larger particulates in the slurry. Controlling such defects constitute one of the largest obstacles to developing advanced copper CMP chemistries based on FA or BA technologies. Minimizing surface roughness is important primarily to achieving a good adhesion interface with a subsequent passivation layer.

"Manufacturability/compatibility" is a set of criteria which for any CMP process and consumable is a measure of how robust from a manufacturing perspective the CMP process is; and how compatible it is for a range of integration schemes. RL solutions are challenging to apply in manufacturing lines. First, RL solutions tend to be very temperature sensitive, which requires that RL process temperatures be strictly maintained at considerable incremental cost. Also, during polishing, RL solutions experience "first wafer" effects where the first few wafers processed polish differently than the succeeding wafers in the lot. This creates wafer-to-wafer variations which reduce yield. In addition, a polishing solution must have a reasonable polishing rate (>2000 Angstroms/minute) to minimize cycle time in CMP. RL chemistries dependant on pH and chemical components have polishing rates that are as low as 500 Angstroms/minute, which is far too slow in a factory production environment.

"Electrical yield" refers to the ability of a copper CMP process to create wafers that consistently meet standard resistance and leakage tests.

The advantages of polishing with an RL vs. a particle-containing slurry typically are: greater planarity, lower defect levels, lower stress to wafer surfaces, and better selectivity. The advantages of using traditional particle-containing slurries are mainly a high material removal rate and a more robust manufacturing capability including larger process windows, ability to clear dense features on MLB, and better process control. The advantages of FA and BA technologies include improved planarity and better selectivity but at the price of a much higher defect rate than traditional or RL slurries.

Some work has occurred in lowering the solid content of CMP slurries as illustrated in U.S. Pat. No. 5,985,748. This teaching overcomes some deficiencies of a 1-step CMP process with a 2-step process in which step 1 uses a high abrasive content slurry to perform bulk removal of metal. Step 1 is terminated short of exposing an underlying ILD layer to abrasion that creates dishing and erosion conditions in the ILD. At this point step 2 is initiated by changing the slurry to one with solid content ranging from zero to about 1 wt %. The reduced solid concentration slurry allows for a greater control over the material removal rate and other CMP conditions for the remaining metal, thus resulting in better planarization.

What is still lacking, however, is a more versatile alternative to solid-less slurries and high solid content CMP slurries. Specifically a CMP slurry is needed which performs bulk copper removal far faster than RL slurries; which clears dense copper features on the wafer far more effectively than current RL slurries do; which lends itself to use in a continuous, i.e., one shurry CMP; and which yields more uniform results and greater stability over successive wafer runs.

SUMMARY OF THE INVENTION

The invention broadly is a CMP processing method using a slurry that provides a low-cost alternative to solid-less RL slurries and high-solid content CMP slurries. The slurry formulations are characterized by a large reduction in the concentration of particles in the solution relative to traditional slurries. In one embodiment, the slurry formulations effect bulk metal removal, for example copper, at favorable removal rates and excellent consistencies from wafer to wafer. The same slurry can continue to be used to effect endpoint and copper clearing, followed by barrier removal and buff. The slurry thus suffices as the only slurry needed in a CMP operation. The operation is continuous, in that its chemistry need not be changed as is necessary with typical 2-step CMP operations.

At the same time, semiconductor manufacturability criteria regulating permissible planarity, dishing and erosion are maintained or even improved with the new slurry. Beneficial results can be realized at particle concentrations of less than 2 wt %; and become more tangible still when the particle content of the slurry is reduced to less than 1 wt %. An exemplary slurry formulated according to the invention sets particle concentration in a range of from 50 PPM to 450 PPM. In another embodiment, particle content centering around 250 ppm has been found to yield benefits over RL slurries, including an eight-fold increase in removal rate, while providing far more consistent stability in polishing quality as manifested in substantial reductions in variations from wafer to wafer.

In specific embodiments, in addition to keeping particle concentration to within greatly lowered bounds, the invention teaches optimal designs for the solution's chemical compounds, the solution pH, and the solution chemicals' concentrations. In a presently preferred embodiment of the invention, the slurry consists of particles and a 3-component solution consisting of an oxidizing agent, a corrosion inhibitor and a complexing agent. Advantageously, the particles are colloidal silica in a concentration maintained at substantially 250 PPM in the slurry. Particle size is centered at sub 100 nm. The complexing agent is dibasic ammonium citrate at a concentration of about 4 wt %. The oxidizing agent is H2O2 with concentration centered at 2.6 wt %. The corrosion inhibitor is triazole with concentration centered at about 1 wt %.

Although particles formed of colloidal silica are especially advantageous in clearing dense minimum features with aqueous solutions of the present invention, other examples of useful material choices for particles include fumed silica, alumina, ceria, and diamond. Alternate complexing agents include acetic acid, ethylenediamine (EDA) and ethytlenediamine tetraacetic acid (EDTA), selected for their ability to form soluble copper complexes outside of the normal solubility range of copper ions in water. Alternate oxidizing agents include ammonium peroxydisulfate, and ammonium perchlorate, selected for their ability to oxidize copper under various conditions (pH, temperature). Alternate corrosion inhibitors include benzene triazole, triazole, benzene imidazole and bypiridyl because of their ability to adsorb to copper surfaces and prevent electron transfer reactions.

CMP slurry formulations kept within specific bounds of very low percent particulate matter and particle type, have been found to usefully meet the several criteria set forth above of residual metal elimination, planarity and defectivity. CMP slurries formulated according to the invention are particularly useful in polishing copper layers; but may be adapted for CMP of any layer in metal-based wafer technology.

These favorable results are achieved in part by the fact that polishing rates realized using the inventive slurry are controlled by the interaction of the particles with the film layers which they contact. In contrast, polishing rates for RL slurries are controlled by the chemistry of the solution (since there are no particles) and the asperities of the polishing pad; and polishing rates for traditional solids-based slurries are impacted by the actual solid concentration. Of the three distinct polishing rate control mechanisms, that of the present invention—interaction of particles with film layers—is more advantageous because this mechanism allows slurries to be tailored simply by controlling the particle concentration without completely new chemical formulations or process changes.

Substantial cost savings may be realized by use of the inventive slurry. Far less of the new slurry is needed to perform CMP for a given yield of wafers than is needed in traditional CMP stages. Further, manufacturing and storage costs for the CMP components are reduced.

DETAILED DESCRIPTION

In formulating a slurry which achieves the above-stated success criteria, several variables must be maintained to within certain bounds. These were determined by experiments described below. Additionally, for some variables, experiment suggests certain optimal or preferred specifications. Workers in the art of slurry formulation will recognize that not just one or a few, but a large number of possible specific slurry formulations may be realized by following the teachings hereinafter provided.

The slurry variables of interest are: particle concentration; chemical components; solution pH factor; chemical component concentrations; and the particle type and material. In finding an optimized slurry, these variables were developed in order. From the results, an overall slurry system for which the chemistry, component concentrations, parts per million of particles, and pH factor are realized.

Figure 1A:
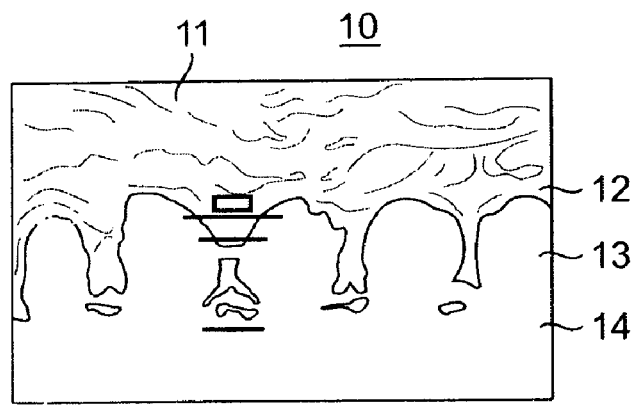
FIGS. 1A and 1B are images of a semiconductor wafer cross-section before and after a CMP step.
Figure 1B:
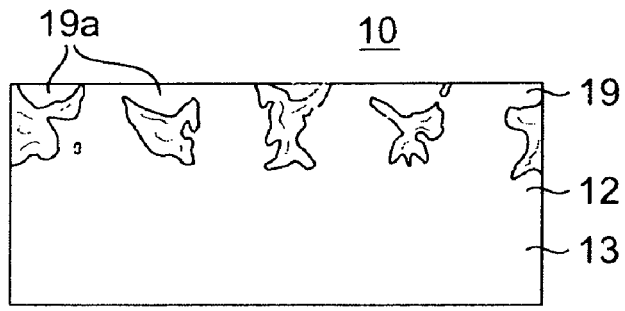
Figure 1C:
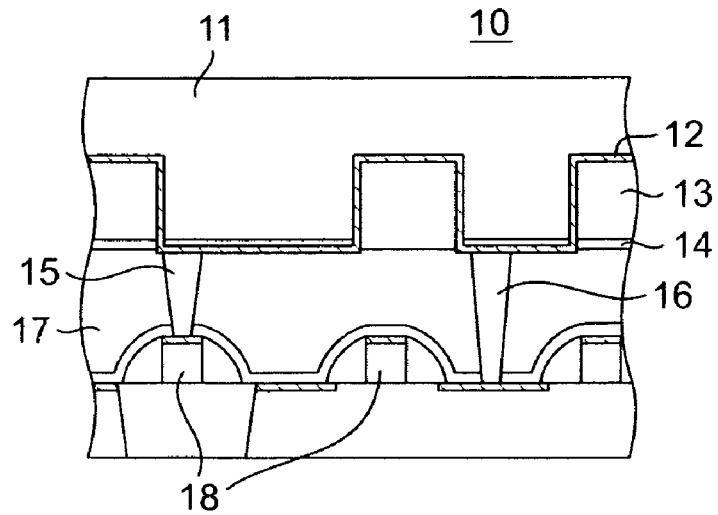
FIG. 1C is a schematic side sectional view of the image of FIG. 1A.

FIGS. 1A-C relate to processing of a transistor(s) for MLB technologies at the first level of metal lines; and are exemplary only it being understood that the slurries to be described are applicable to manufacture of a wide range of device wafers. FIG. 1A is an image of an 0.13 micron semiconductor wafer 10 at a stage where copper 11 has been deposited. Referring also to FIG. 1C, beneath copper layer 11 is a barrier layer 12, a dielectric layer 13 and etch stop layer 14. Tungsten contacts 15, 16 are formed into dielectric layer 17 and make contact with devices denoted generally as 18 which may be any of various semiconductor devices. The copper and barrier layers at this point extend across the wafer's surface. FIG. 1B shows wafer 10 after the copper CMP process has terminated at a plane of completion 19 including the planarized copper metallization upper surfaces 19a. The CMP step has isolated the copper lines by removing the copper/barrier metal not isolated in features. In the experiments described below, wafers consisting of low-k dielectric and copper metallization were employed. The specific wafer type was K79W, which is a Motorola test vehicle for 0.13 micron technology. The wafers were processed to the Metal 1 CMP stage by traditional means; and all experiments were carried out at the Metal 1 stage.

Particle Concentration

Figure 2:
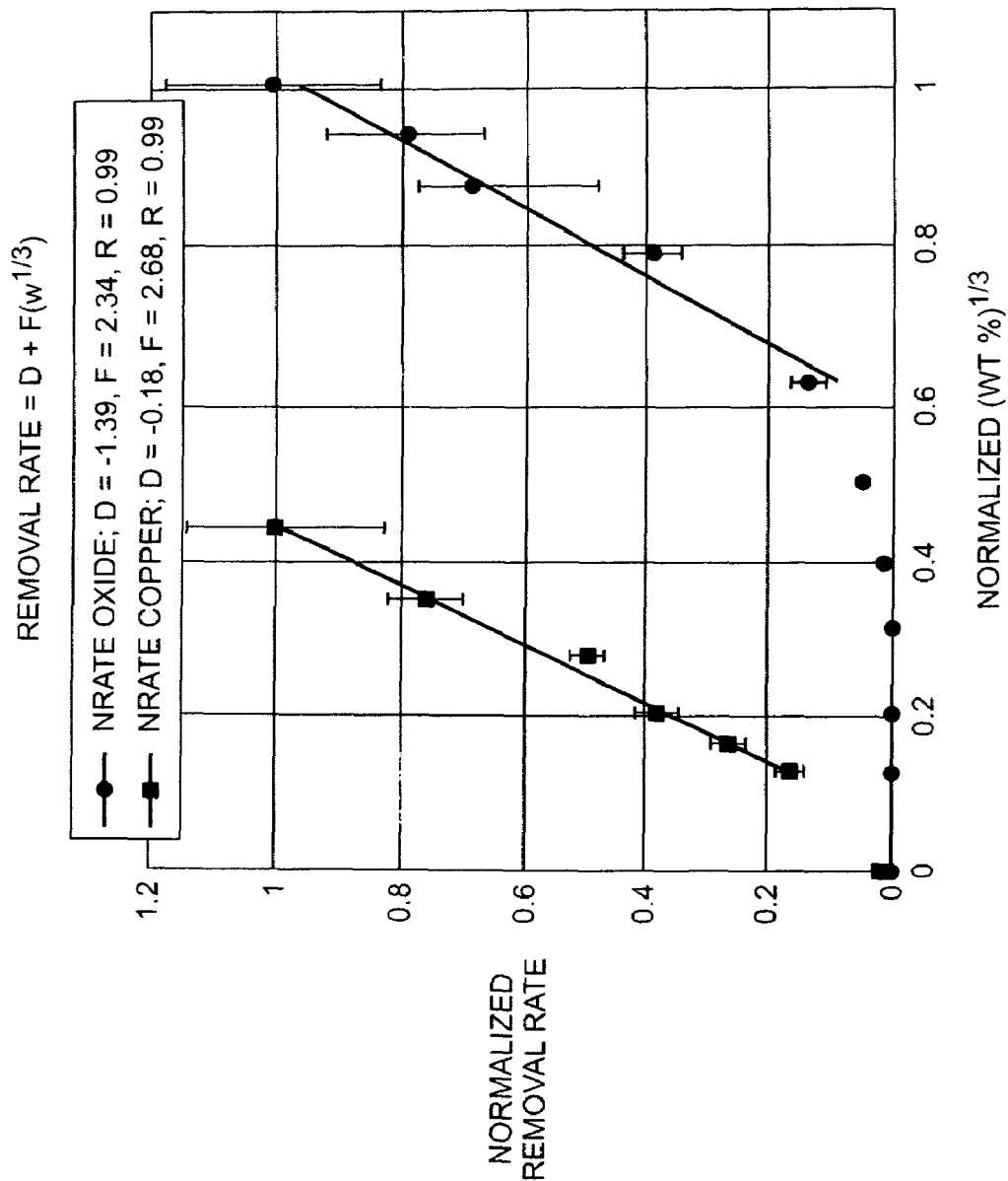
FIG. 2 is a graph showing normalized removal rate vs. normalized wt % slurry particles for oxide and copper materials.
Figure 3:
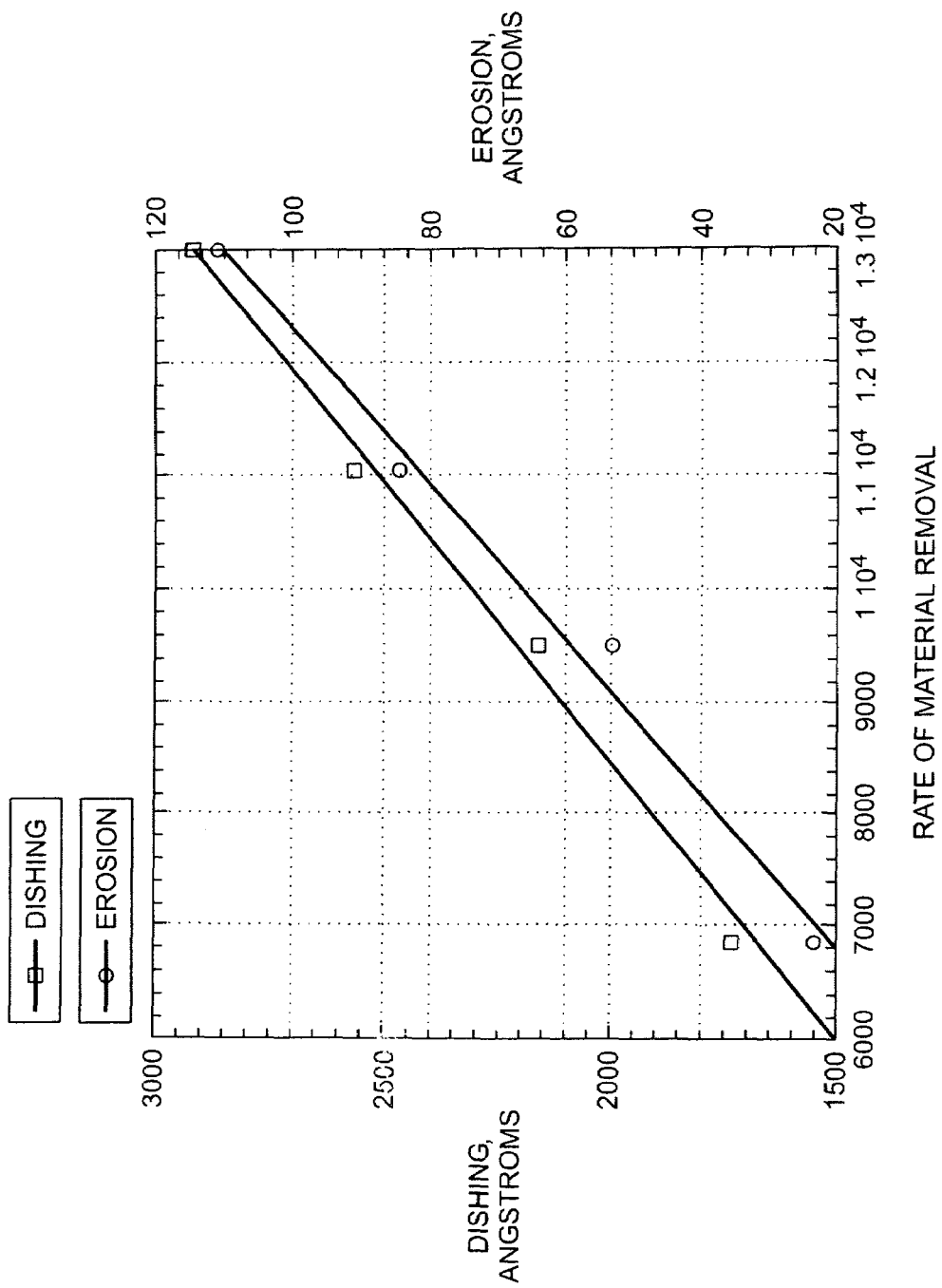
FIG. 3 is a graph showing dishing and erosion as a function of material removal rate.

In the present formulation, particle concentration in wt % is the variable of foremost interest. In one set of experiments, the particle concentration was varied from 0 PPM (0 wt %) to 10000 PPM (1 wt %) using sub 100 nm colloidal silica particles. Results indicated that polishing rate increases with wt % to the ⅓ power, as plotted in FIG. 2. However, it was found that planarity increases linearly with the removal rate; that is, as removal rate increases, it becomes more difficult to achieve planarity objectives. It therefore is desirable to use the minimum solid particle content that still clears all features, as illustrated by the chemistry recitations of FIG. 3.

Solution Chemical Components

Traditional copper slurries are composed of between 2 and 7 chemical components. These typically include an oxidizing agent, a complexing agent, a corrosion inhibitor, surfactants, biocides, and a buffer to adjust the pH. Oxidizing agents can include hydrogen peroxide, ammonium peroxydisulfate, and ammonium perchlorate. Complexing agents can include ammonium citrate, acetic acid, ethylenediamine (EDA) and ethytlenedieamine tetraacetic acid (EDTA). Corrosion inhibitors include benzene triazole, triazole, benzene imidazole and bypiridyl. Surfactants include polyethylene glycol (PEG), and block copolymers where blocks may contain ethylene-oxide (EO) and propylene-oxide (PO).

One way to formulate the low-particle concentration slurry is by adding minimal particle quantities, i.e., <1/1000 part traditional slurry to a RL liquid solution.

By way of example only, a preferred three-component chemistry was developed composed of an oxidizing agent, a complexing agent, and a corrosion inhibitor. The starting point is an aqueous system based upon citric acid. Citric acid is a tridentate which means it has three branches where surface groups (specifically an ammonia group) can be added. Without any surface groups, citric acid has a pH of 1.5; but with the addition of a first ammonia group, citric acid becomes monobasic ammonium citrate with a pH of 3.5, By adding a second ammonia group, it becomes dibasic ammonium citrate (pH 5). With the addition of a third ammonia group it becomes tribasic ammonium citrate (pH 7.5). The base of citric acid makes possible the fixing and varying of solution pH without significantly altering the chemical composition. Either dibasic or tribasic ammonium citrate may be used as the base of the CMP slurry. The selection of triazole and benzene triazole ("BTA") is based on their well-known utility as corrosion inhibitors; but other corrosion inhibiting agents may also be used. Advantageously, solutions containing triazole as the corrosion inhibitor adequately cleared dense features.

Solution pH

As an amphoteric compound, copper forms soluble hydroxides in both acidic (pH<5.5) and basic (pH>10) pH regimes in the absence of complexing agents. But copper hydroxides are insoluble in neutral pH regimes (5.5<pH>10). Experiments were designed to develop chemistry in acidic and close to neutral pH regimes. Because copper is less soluble in the neutral pH regime, better planarity may be expected using neutral pH regimes because here the copper within metals lines won't dissolve as much during polishing. In addition, a neutral pH polishing chemistry may control film removal by a different mechanism than the mechanism driving film removal using an acidic or basic pH polishing chemistry (i.e. dissolution rate-limited versus kinetic rate-limited). However, because copper is less soluble at a neutral pH, it may be harder to clear dense minimum pitch features in the neutral pH regime. Optimum results were obtained at a pH centered on 5 with the three-chemical component system of dibasic ammonium citrate, hydrogen peroxide, and triazole.

Solution Chemical Concentrations

The next step is to window the concentration of each of the components. For the three-chemical component system of dibasic ammonium citrate, hydrogen peroxide, and triazole the initial concentration ranges for each component were determined from experiments on blanket copper wafers. Blanket copper wafers were pre-measured for thickness using a commercially available metrology tool. The wafers were then polished for one minute on a commercially available polishing platform using the experimental slurry. The wafers were then re-measured for thickness on the metrology tool and removal rate was determined.

Figure 4:
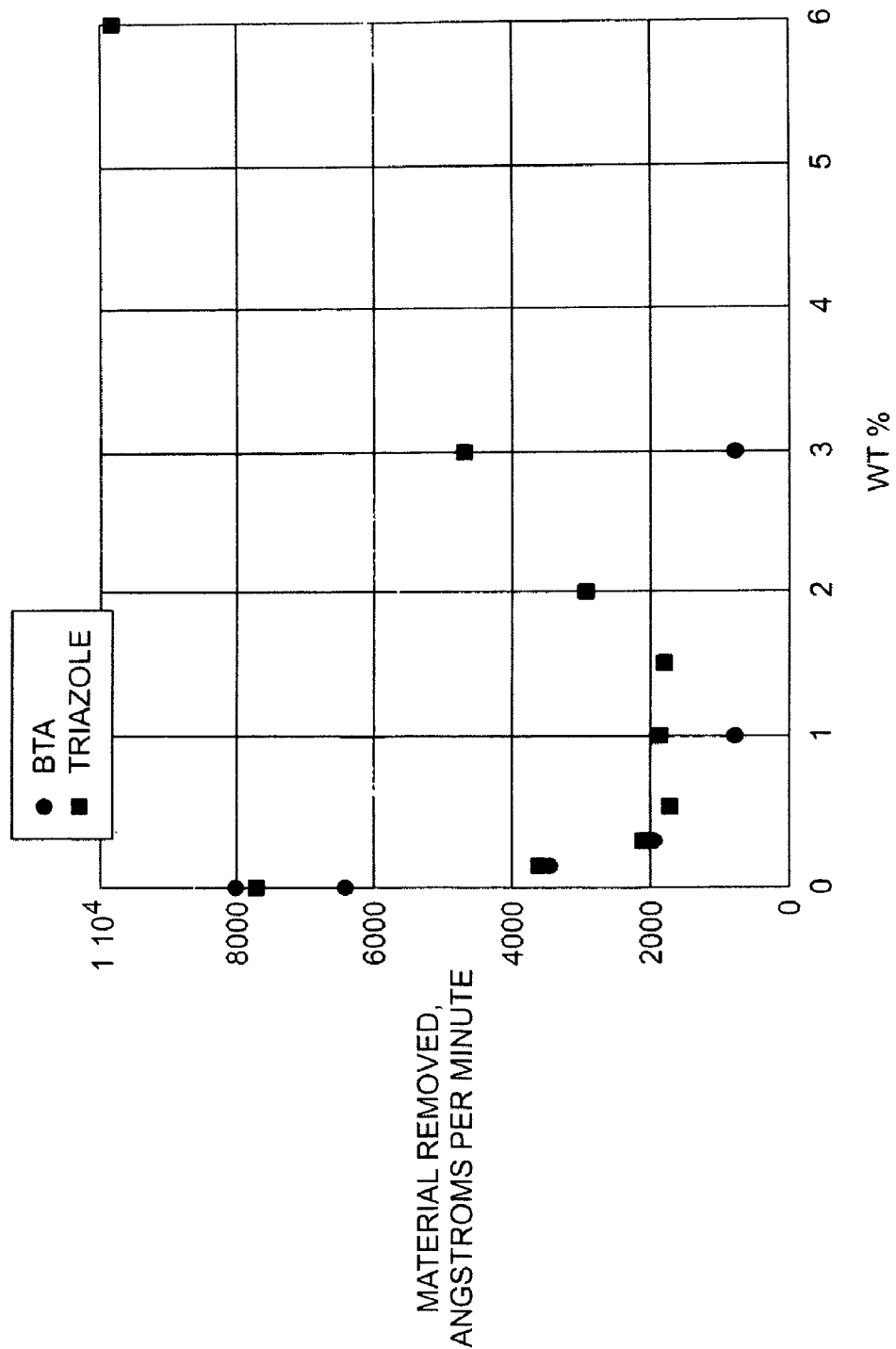
FIG. 4 is a graph showing for triazole and for BTA their presence in wt % of slurry vs. material removal rates.

The triazole concentration was windowed from 0 to 6 percent by weight and the removal rate was measured. A local minimum was found around 0.85 wt %, as seen in FIG. 4. It was also interesting to note that after approximately 1.5 wt % the removal rate increases linearly with triazole concentration; whereas with BTA removal rates continue to be repressed by increases in corrosion inhibitor. Therefore windowing may advantageously be designed around a triazole concentration of 0.85 wt %, where triazole demonstrates a robust positive impact.

Figure 5:
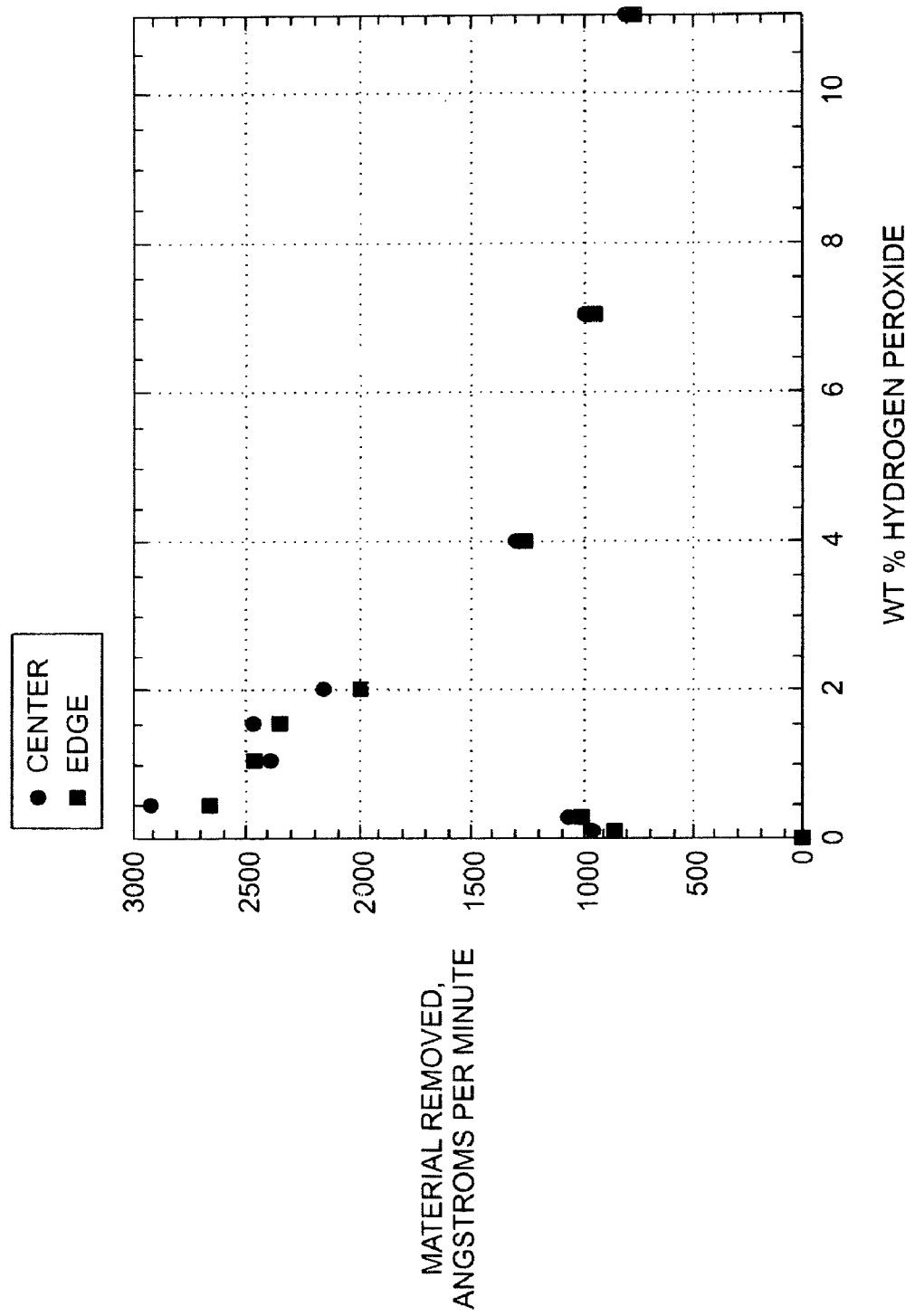
FIG. 5 is a graph showing wt % of hydrogen peroxide in slurry vs. material removed.

The hydrogen peroxide concentration was windowed from 0 to 12 percent by weight and the removal rate was measured. A local maximum was found around 0.5 wt %, as shown in FIG. 5. However, it is a sharp maximum and it is undesirable to operate in such a range where rates could fluctuate extremely with the decomposition of peroxide. Because hydrogen peroxide decomposes with time, the hydrogen peroxide concentration advantageously is centered sufficiently above the maximum. The objective is to realize a substantial removal rate with enough peroxide being available to compensate for extended decomposition of the peroxide due, for example, to storage or shipment time.

Figure 6:
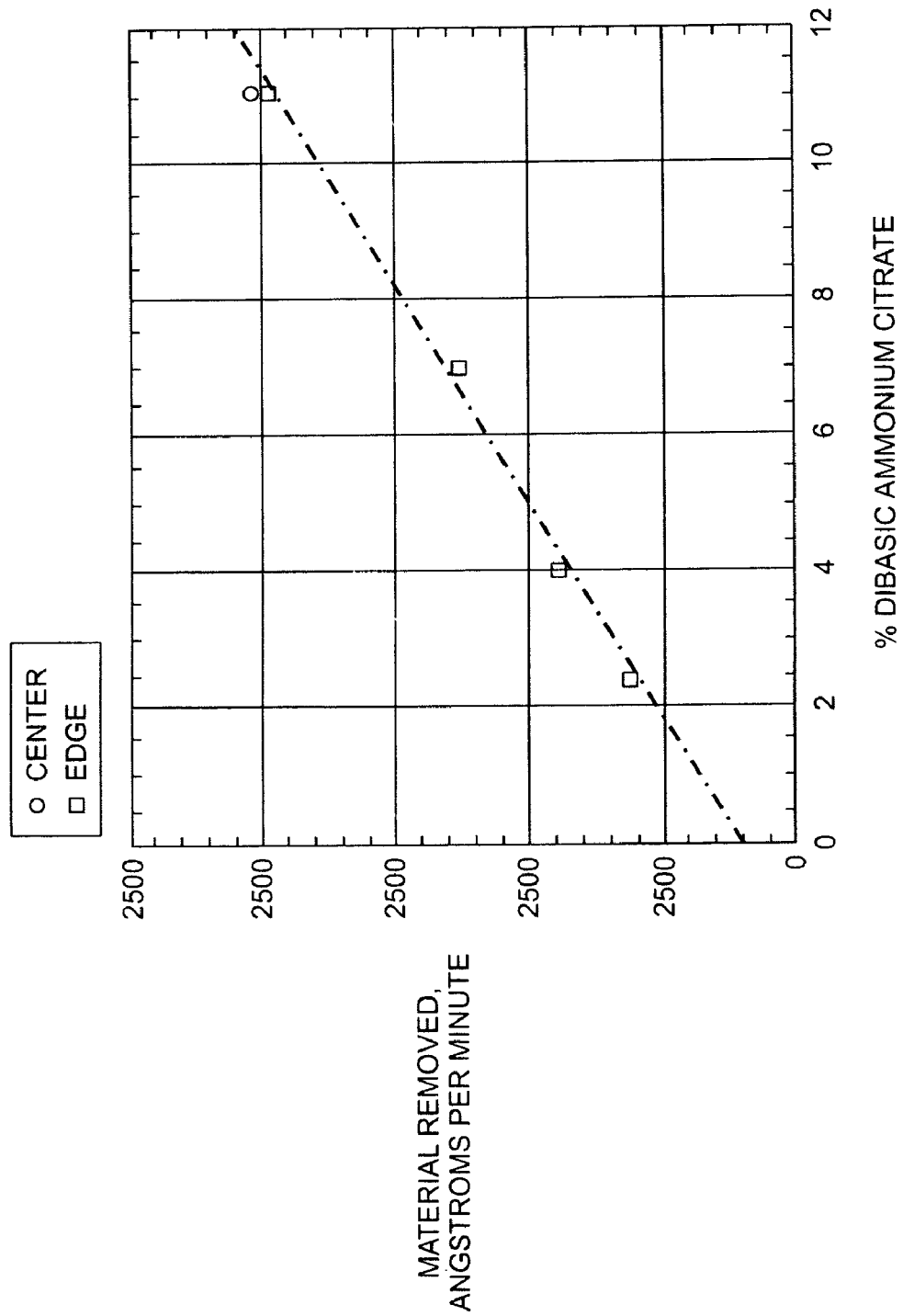
FIG. 6 is a graph showing wt % of dibasic ammonium citrate in the slurry vs. amount of material removed.

The dibasic ammonium citrate concentration was windowed from 0 to 12 percent by weight and the removal rate was measured. A linear trend was found between removal rate and dibasic ammonium citrate concentration as shown in FIG. 6. A dibasic ammonium citrate concentration centering on about 4 wt % was found to yield optimal planarity results.

Particle Types and Sizes

Several different particle types and materials were examined experimentally. The materials chosen were several currently used in commercially available CMP slurries, including colloidal silica, fumed silica, alumina, ceria, and diamond. A first set of experiments was conducted to determine the copper removal rate for each particle type in a particular chemistry consisting of dibasic ammonium citrate at a concentration of about 4%, H2O2 with concentration centered at 2.6 wt % and triazole with concentration centered at about 0.85 wt %. Then, Metal 1 copper 0.13 micron wafers were polished using each particle type at 250 PPM. Solutions respectively containing each of these particles according to the invention are advantageous. However, use of colloidal silica showed better planarity results compared to the other abrasives tested with this specific chemistry. Larger particle sizes created more defects on the surface in the form of scratching. Based on these considerations, an exemplary solid for use in the inventive slurry is sub 100 nm colloidal silica.

Performance of Slurry Formulation

RL slurries are known for an inability to clear dense minimum pitch features. For the formulations described above, however, adding <200 PPM of solids to a solid-less RL solution cleared dense minimum features such 0.13 micron copper lines separated by 0.13 micron low-k dielectric for a snake and comb arrangement.

Figure 7:
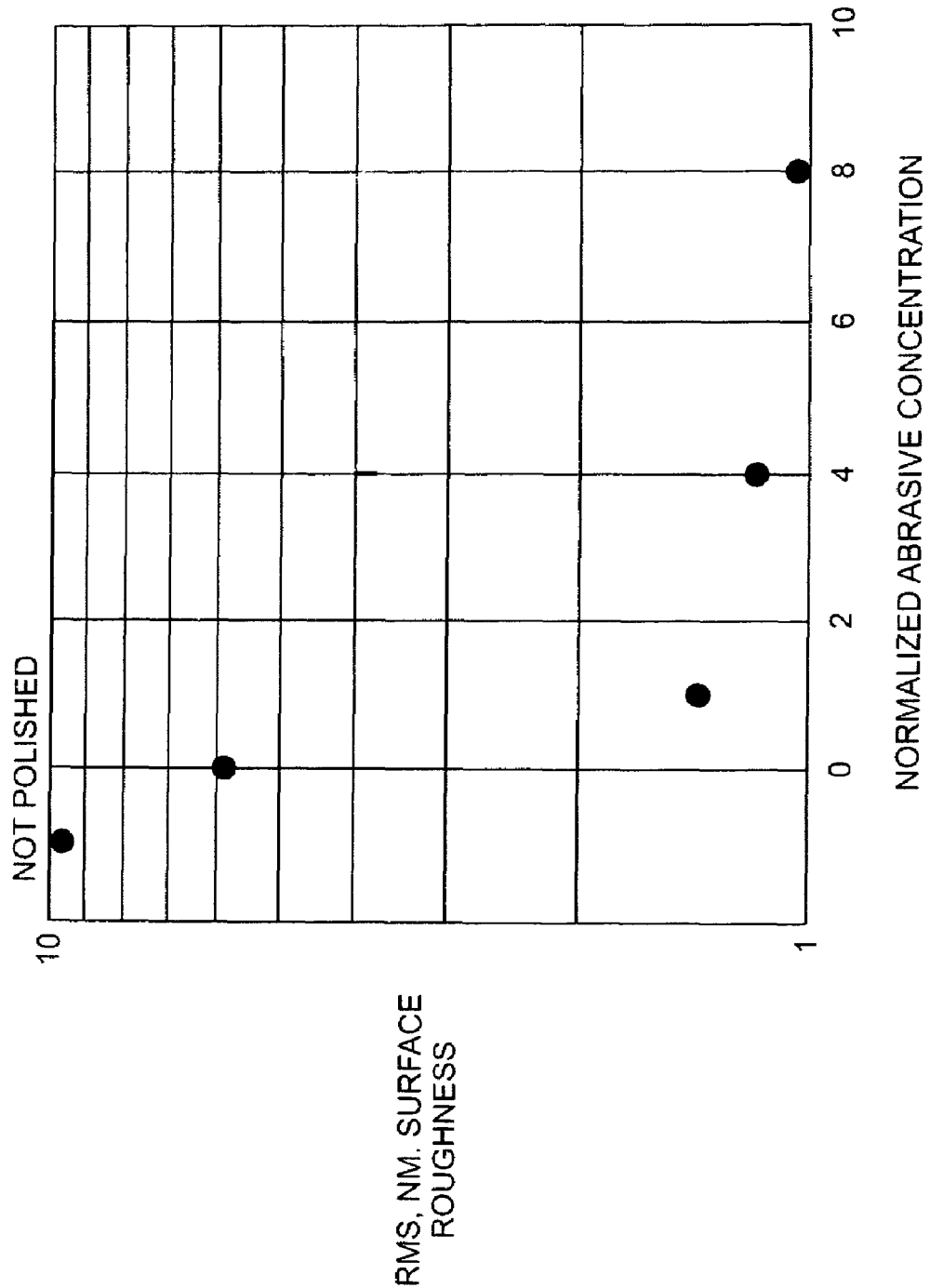
FIG. 7 is a graph plotting surface roughness reductions vs. abrasive concentration.

Scratching and gouging was measured on patterned Cu/ULK wafers using a commercially available metrology; and roughness was measured with an atomic force microscope on blanket copper wafers. By adding small amounts of solids, it can be seen in FIG. 7 that surface roughness decreases significantly.

Figure 8A:
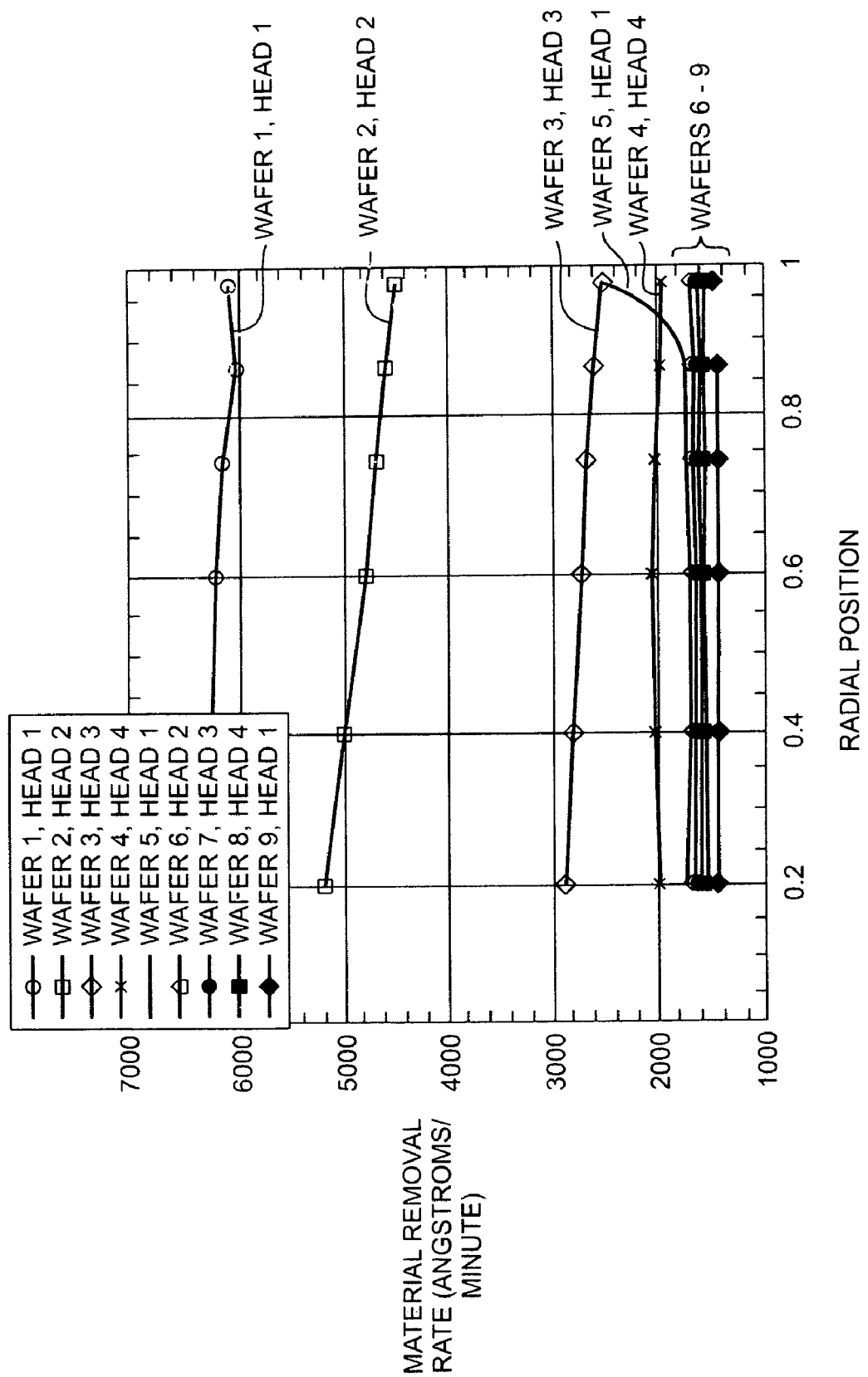
FIGS. 8A and 8B are two plots of material removal experience at zero PPM and 250 PPM particle concentrations illustrating improvement in process stability.
Figure 8B:
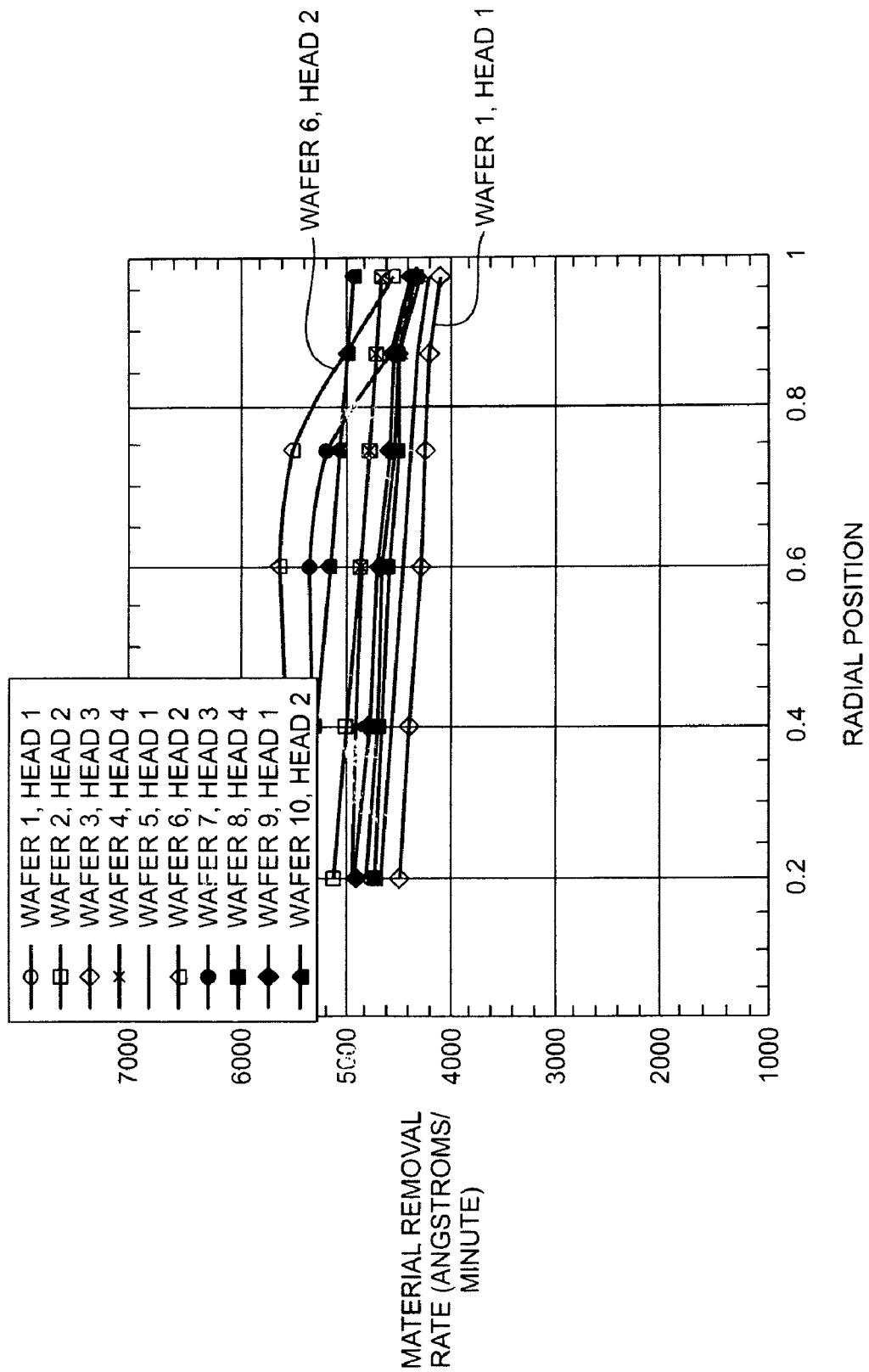

By specifying in the range of 50-450 PPM and more advantageously 200-250 PPM of solids to the above-described solutions, the "first wafer" effect which occurs with use of RL slurries is effectively eliminated. This enhanced process stability is illustrated in FIGS. 8A and 8B. FIG. 8A shows results of polishing nine consecutive copper blanket wafers, numbered 1 through 9 with a conventional (RL) slurry having no particles (0 PPM) and using four different heads numbered 1 through 4. The variance in material removal rate is illustrated by comparing the removal rate on wafer 1 with that of wafer 3, which is a difference of over 4000 Angstroms/minute at radial position 0.6 on the wafer. The maximum difference is greater still for this wafer batch. In contrast, as shown in FIG. 8B, using the inventive slurry at a concentration centered on 250 PPM the material removal rates for ten different copper blanket wafers numbered 1 through 10 polished with four different heads numbered 1 through 4, demonstrate a markedly improved overall variance. For example, the maximum variance at wafer radial position 0.6 for all ten wafers is no more than 1500 Angstroms per minute; and far less than that on average.

Figure 9A:
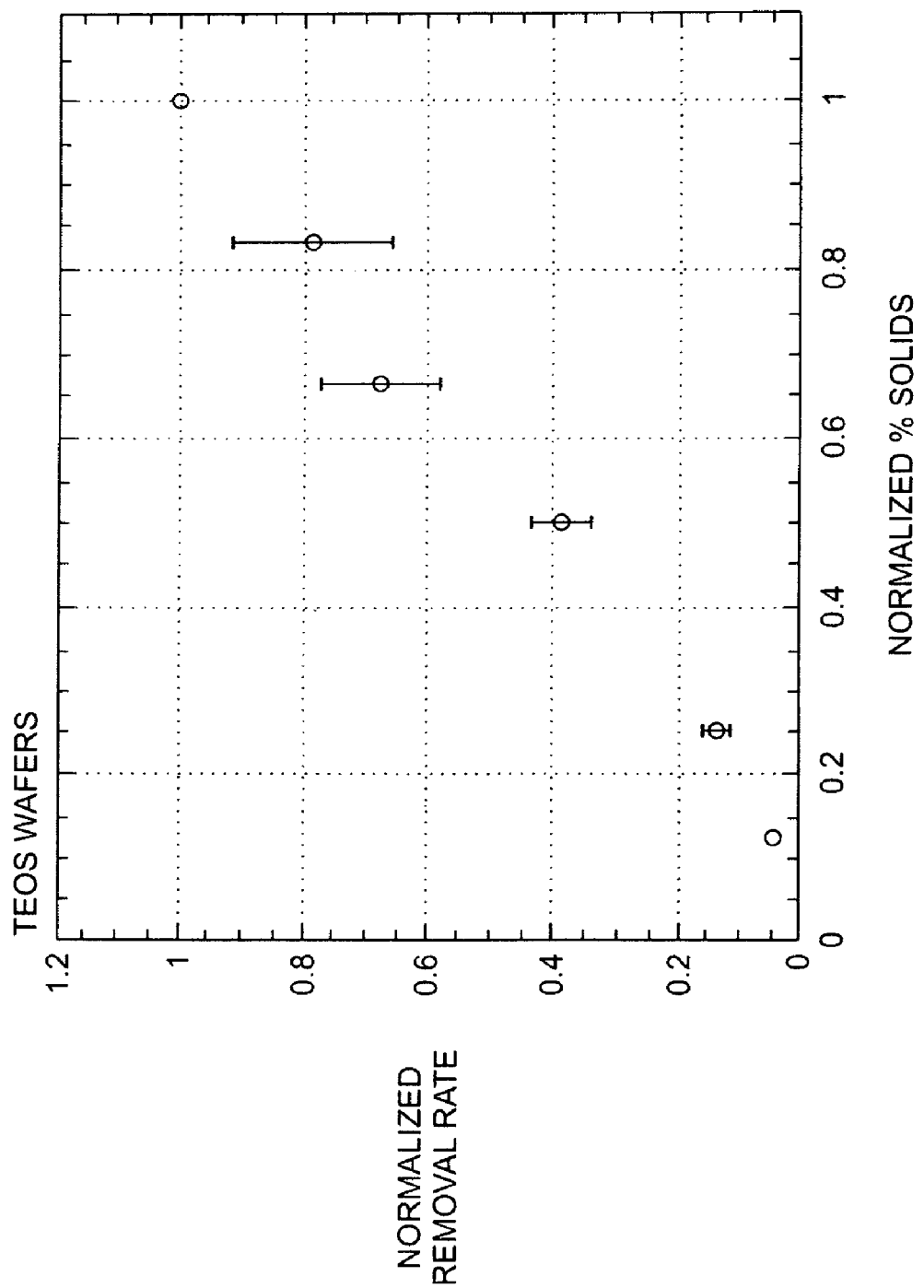
FIGS. 9A and 9B are plots showing for TEOS and copper wafers increases in material removal rates with addition of particulate solids.
Figure 9B:
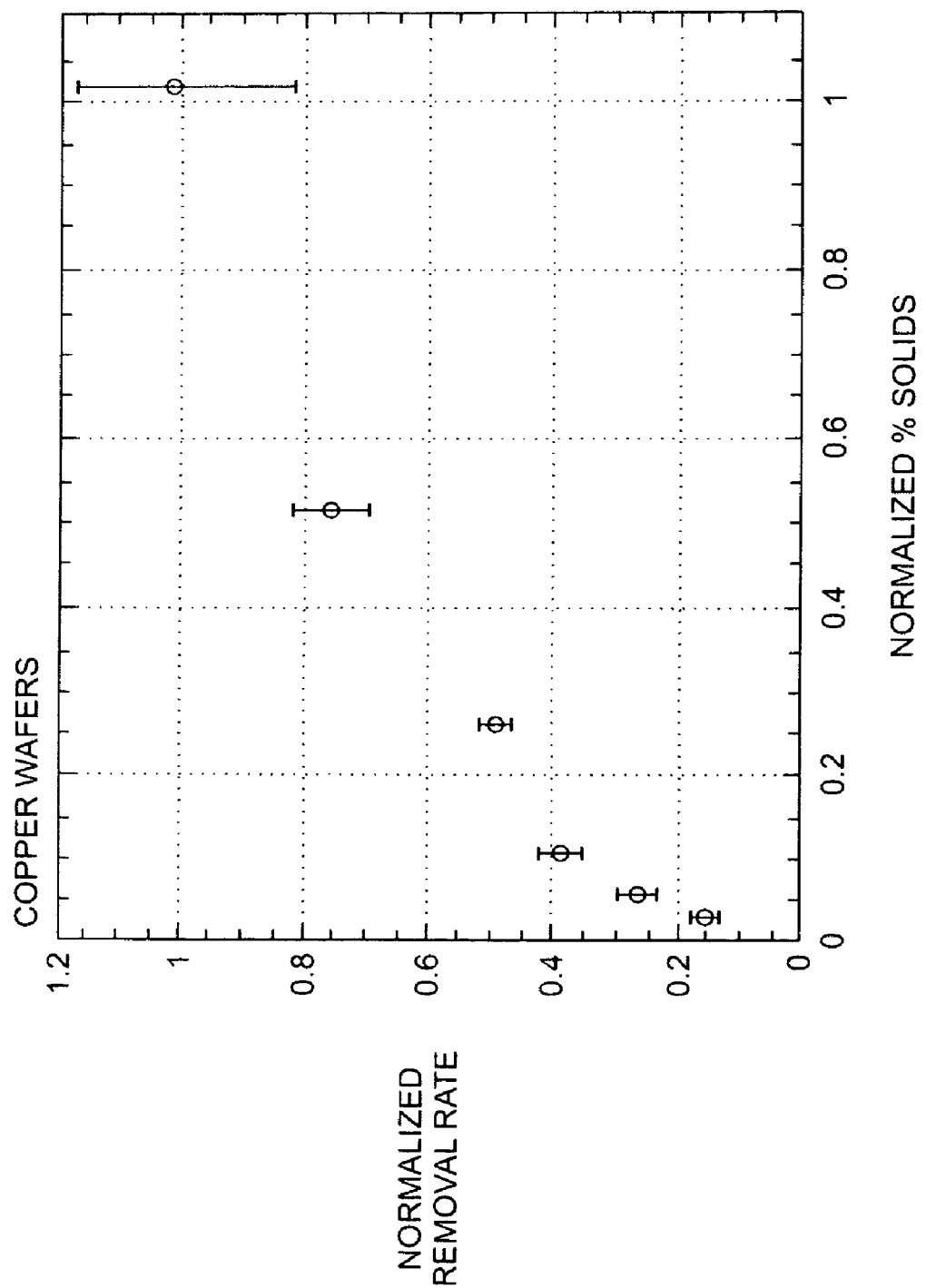

A polishing solution must have a dependable polishing rate on the order of >2000 Angstroms/min, in order to minimize cycle time in CMP. Certain RL chemistries dependant on pH and chemical components can have minimal polishing rates, on the order of 500 Angstroms/minute. By specifying, for example, a bound of <250 PPM solids concentration in the above Cu system the polishing rates increased dramatically as is seen in FIGS. 9A and 9B. A particle concentration centering on 250 PPM optimized planarity while still clearing all features of the integrated circuit. Removal rates for copper wafers begin at about 0.025 wt % solids; whereas for TEOS wafers the removal rate is less steep. Higher removal rates using higher concentrations may be advantageous in given applications, provided planarity can be maintained, through formulations of up to 1 wt % solids; and with careful formulation engineering, also in the range of from 1 wt % to an upper bound approaching 2 wt % solids.

Optimization of Slurry

It is necessary to optimize the particle concentration, the solution's chemical compounds, the solution pH, the solution chemicals' concentrations, and the particle type and size. In developing slurries according to the invention, centering particle concentration at about 250 PPM with a variation of about +/−200 PPM is preferred. Centering particle size at sub 100 nm, that is, wherein the particles have a mean size of about 100 nm with a variation of about +/80 nm is preferred. Using colloidal silica as the choice of particle material is preferred although any of the materials including ceria, alumina, diamond, fumed silica, titanium, and polymer-based colloids such as polystyrene are viable alternative materials, provided the designer takes into account the mechanical properties of the system in selecting the particulate.

With the particle-related design choices made, the corrosion inhibitor of choice is triazole with concentration centered at 0.85 wt %, and a +/−0.5% wt % permissible variation. The complexing agent of choice is dibasic ammonium citrate at a concentration centered at 4 wt % with permissible variation of +/−1 wt %. The oxidizing agent of choice is hydrogen peroxide at a concentration centered at 2.6 wt % with permissible variation of +/−0.5 wt %.

Optimal polish performance was found at values centered on 4 wt % dibasic ammonium citrate and on 1 wt % triazole.

FIGS. 1A and 1B illustrate the present low solid content slurry in connection with a copper metal semiconductor device with low-k dielectric layers. However, the invention with appropriate adaptations within the skill of those practicing in the art may also be usefully applied without limitation, to CMP of aluminum or tungsten or other metal layers; to a range of conventional semiconductor materials; and to traditional dielectric layers and low-k dielectric layers. The reduced solids concentration slurry may be applied in polishing essentially any film in any semiconductor layer. By way of example only, the slurry may be used in polishing: metal surfaces including copper, tungsten, and aluminum; dielectric surfaces including TEOS (TetraEthylOrthoSilicate), BPSG (BoroPhosphoSilicate Glass), PSG (PhosphoSilicate Glass) or SOG (Spin on Glass); low-k dielectric surfaces including SiC, SiOC, and organic polymeric materials such as: polytetrafluoroethylene, benzocyclobutene, polyimide, and polyaryl ether; barrier layers including tantalum, tantalum nitride, tantalum silicon nitride, titanium/titanium nitride, tungsten nitride, or tungsten silicon nitride; contact pad regions formed of metals or of alternate materials including titanium silicide, cobalt silicide, nickel silicide, for example. Examples of structures which may be formed within the invention are shown in, for example, U.S. Pat. No. 5,985,748 which is incorporated by reference.

Figure 10:
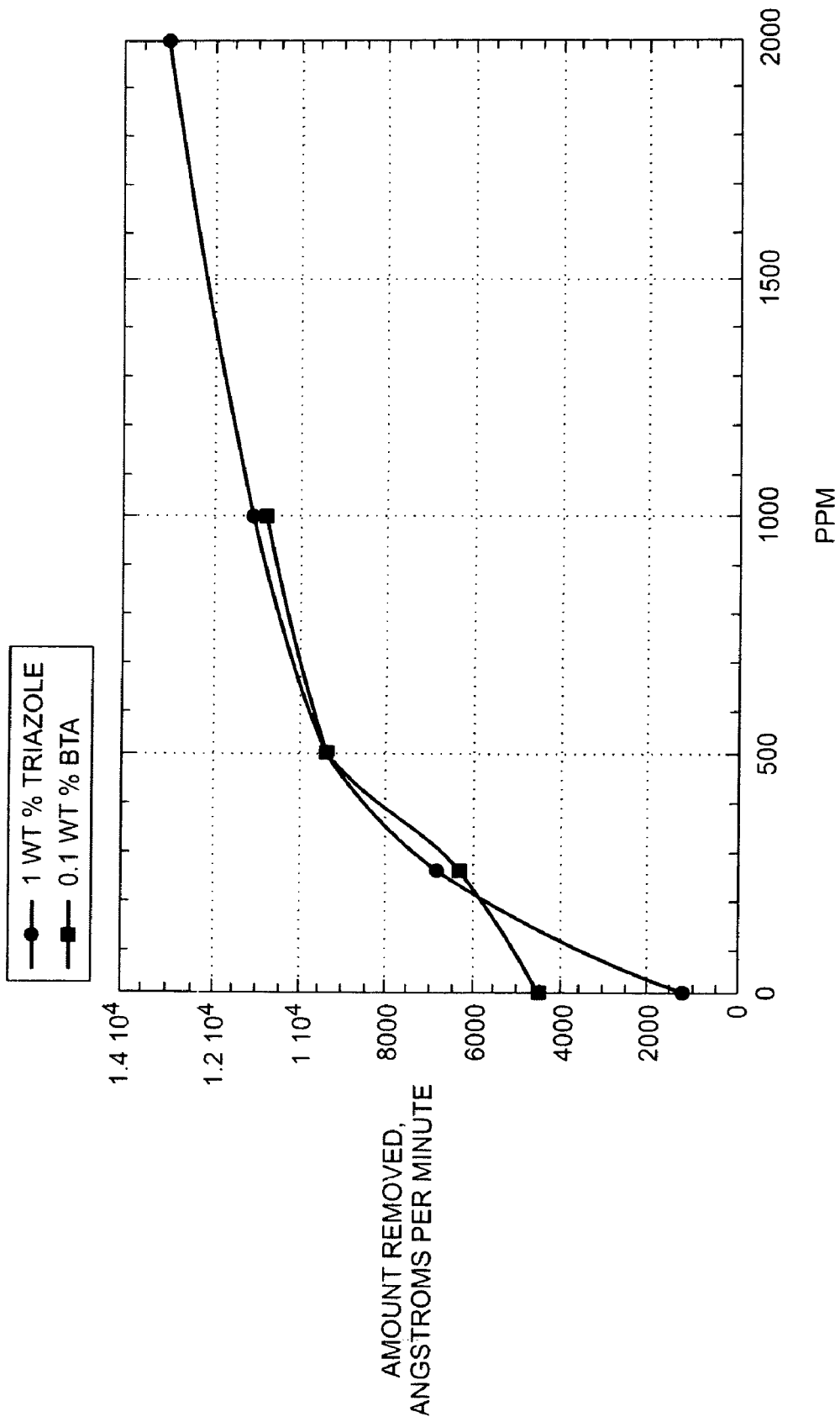
FIG. 10 is a graphical comparison of material removal vs. PPM particle concentrations.

FIG. 10 shows the polishing rate performance of the current slurries. At 0 PPM particle concentration (the case for reactive liquid slurries), material is removed at a relatively low rate. Polishing rate (and thus polish performance) for RL slurries is controlled by the chemistry and the polishing pad asperities. For the current invention, using triazole as the corrosion inhibitor, as particle concentration increases from the initial 0 PPM to about 2000 PPM, material removal rate increases; at first, rapidly up to about 450-500 PPM concentration and thereafter less rapidly. A similar removal rate increase was found for BTA in the range of concentrations tested. At the point of 2000 PPM, the current slurry has a particle concentration of about 0.2 wt %, which is but 1/10th the concentration of the lower range of solid content slurries. Polish performance for traditional solids-based slurries is controlled by factors relating largely to the processing tool and their applicators (i.e. tool configuration and other consumables: pads, conditioners, and rings) and thus is independent of the slurry and slurry chemistry. However, polishing rate for slurries formulated according to the present invention is controlled by the interaction of the particles with the film being removed. This is advantageous because it gives the designer of the CMP process a means of tailoring or optimizing the process without either formulating a whole new chemistry (i.e., RL) or making expensive tool upgrades as would be necessary for traditional slurries. Simply by varying the particle concentration, size and shape, CMP slurries can be customized to different applications.

The promise of large cost savings from use of the inventive slurry is readily demonstrated. Traditional CMP slurry formulations consume very large quantity of abrasives, The current market for CMP slurries is over $250 million a year world-wide. The reductions in solid content in slurries made possible by the present invention will save substantially on slurry cost. For example, a slurry formulated around the center point of 250 PPM will use between 1/100 and 1/1000 the amount of slurry that ordinarily would be used. Also, savings accrue because of reductions in associated cost for slurry storage, quality control equipment, and manufacturing time (i.e., for switching slurry drums).

The invention affords an additional and, in many ways more advantageous, way for varying the selectivity at different points in a single step in the CMP process. Selectivity is the ratio of removal rates of one film material to another film material. During copper CMP, it is possible to have exposed copper, exposed barrier (including Ta, Ti, W), and exposed dielectric (including TEOS, SiC, SiCN compounds). The goal is to create interfaces that are as planar as possible. Chip-building integration schemes exist that require CMP to clear dielectric film once the copper is isolated, either to create more spacing between lines or to clear a higher dielectric constant capping material that protects a low-k dielectric. Therefore at different times during a single step in the polish process, it might be optimal to switch selectivity so as to either polish more dielectric or to not do so. It is usually difficult to vary selectivity in the middle of a CMP stage. However, by starting with slurry made according to the invention at an initial PPM concentration and then either ramping up or ramping down the PPM, selectivity is easily varied. For example, if one is operating at 0.6 wt % as in FIG. 2, the copper and oxide films would both be experiencing substantial removal rates. However if one ramped down the PPM from 0.2 wt % to 0.4 wt %, then the oxide removal rate will be near zero and the selectivity will change. This way of varying selectivity is especially useful where the integration requires initial removal of a dielectric cap but does not require further removal once the low-k dielectric is exposed.

Figure 11:
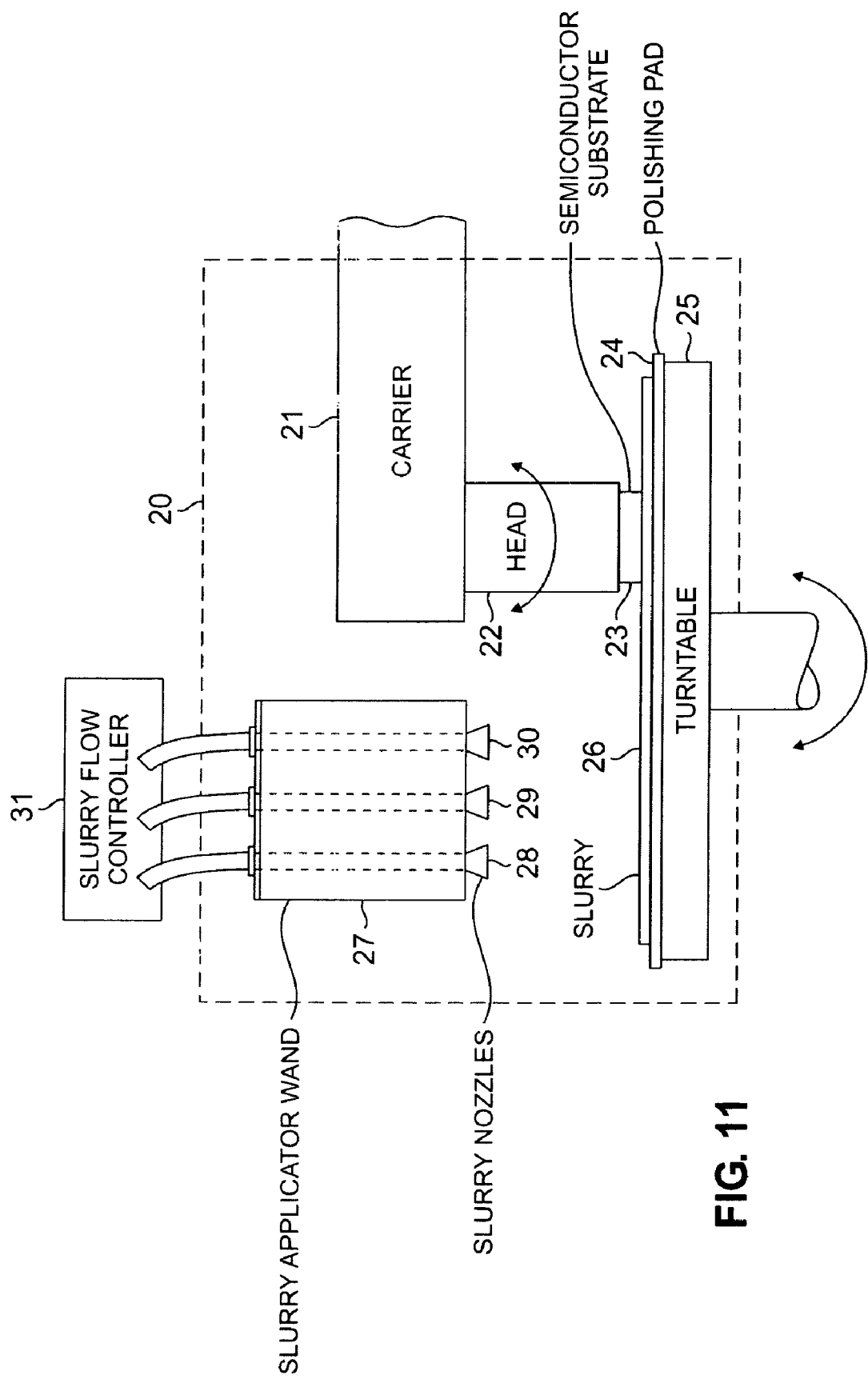
FIG. 11 is a schematic diagram of apparatus showing use of present slurry to achieve selective material removal.
Figure 12:
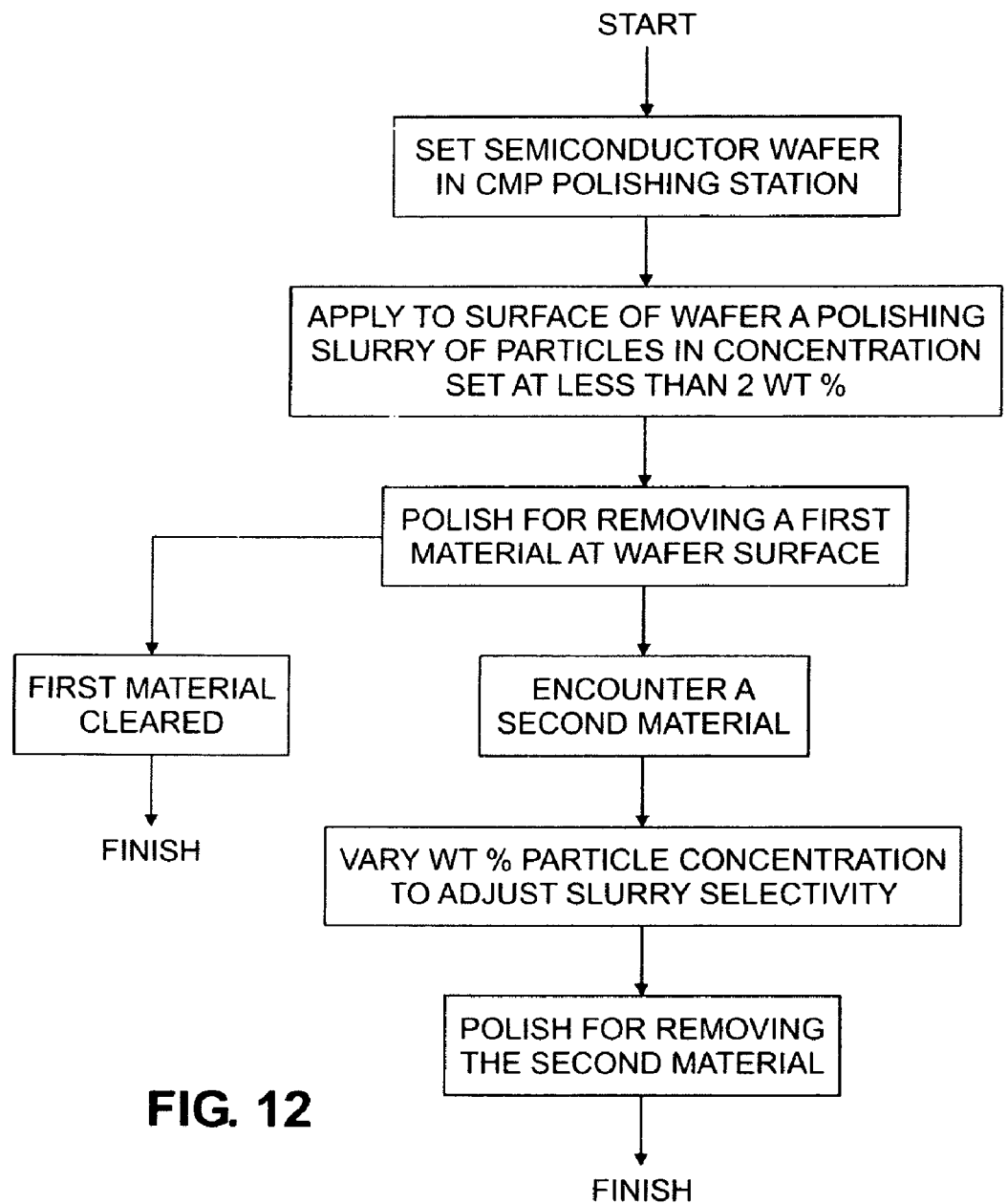
FIGS. 12 and 13 are process flow charts.

FIG. 11 illustrates a CMP polishing apparatus station 20 which uses slurries formulated according to the invention in a continuous CMP polishing process, where different selectivities are required at different times. The station 20 consists of a carrier 21 and a rotating head 22 which is rotated and positioned by carrier 21. On head 22 is mounted a semiconductor substrate 23 to be polished during a designated time in the wafer layer build-up. A polishing pad 24 is mounted on a platen 25. Slurry 26 is introduced onto the pad 24 from an applicator head 27 which may have several slurry nozzles 28, 29, 30. A slurry flow controller 31 is programmed by means (not shown) to apply different slurries at designated times from the separate nozzles. If the layers to be polished consist of, for example, a metal layer and a dielectric layer, these layers will not polish at the same material removal rates when subjected to a given slurry. As the CMP process approaches a material interface therefore, rather than continuing to polish with the first slurry applied for example from nozzle 28, that nozzle is shut off; and a second slurry formulated according to the invention with the desired different selectivity is applied to the process from nozzle 29. Another way to vary the selectivity using the apparatus of FIG. 11, is to apply a slurry formulated according to the invention during a first CMP stage requiring a certain selectivity; and then when selectivity is to be varied, to either decrease or increase the flow rate of the low-solid slurry using controller 31. In this embodiment, only one nozzle may be needed. An example of the steps followed in this process is provided in the flow chart of FIG. 12.

Figure 13:
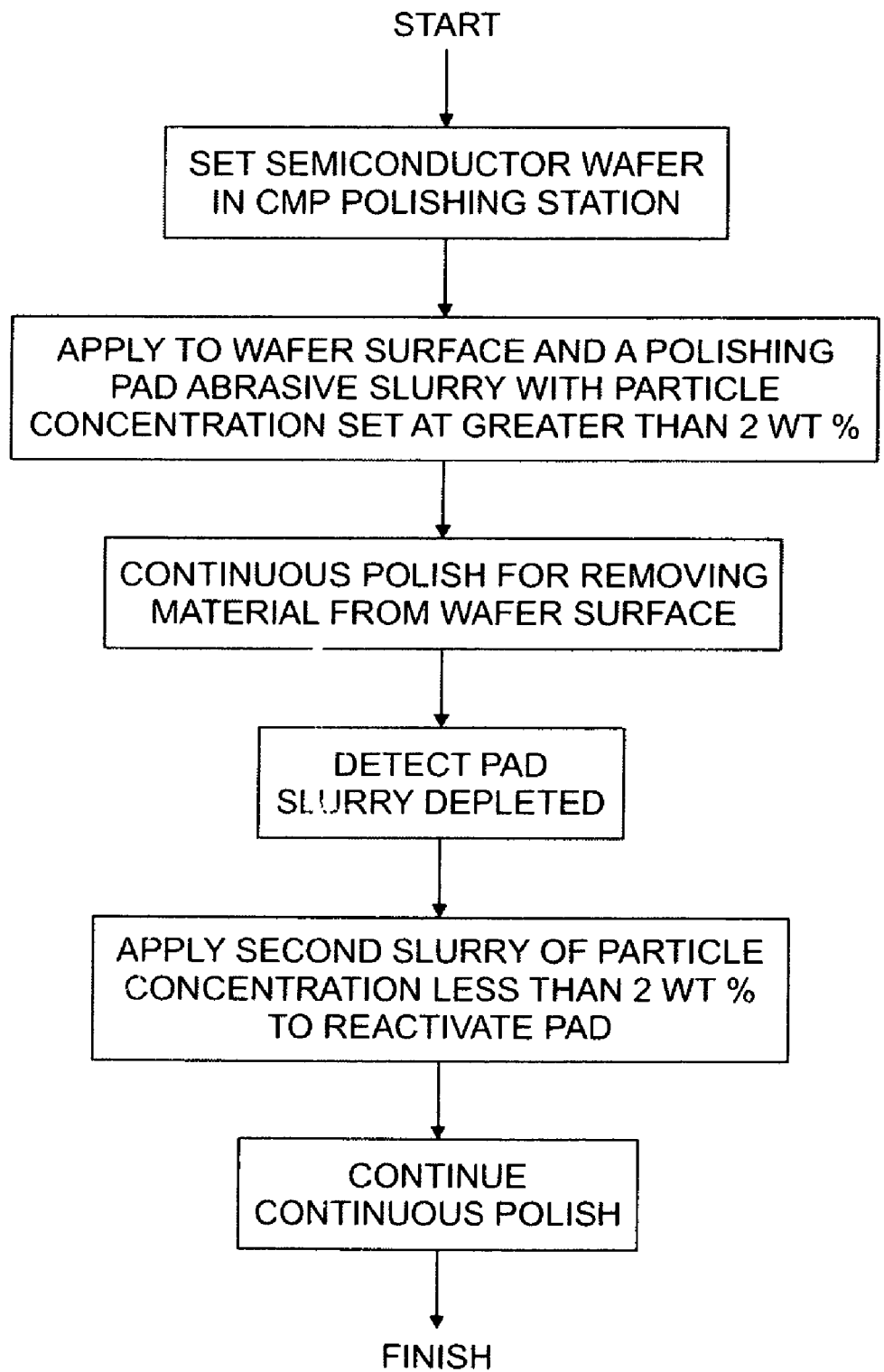

Another use of the invention is with fixed abrasive and bonded abrasive CMP processes. FA and BA polishing stops once a planar surface is achieved. However, by pulsing the present slurries into the FA or the BA system, an FA/BA pad can be reactivated by the interaction of the pulsed particles with the pad without substantially changing the polish mechanism. An example of the steps followed in this process is provided in the flow chart of FIG. 13.

In summary, the invention realizes a low-cost slurry that removes material at a high rate; but does so while achieving high planarity, minimizing residual material, minimizing defectivity and assuring high yield. Moreover, the slurry achieves these results consistently from lot to lot.

The invention claimed is:

1. A process for the formation of semiconductor wafers, wherein said wafers comprise a plurality of layers, each said layer comprising a metallic material and a dielectric material, said process comprising the steps of:
   providing a chemical-mechanical planarization wafer polishing station;
   providing to said station a plurality of semiconductor wafers having exposed a said layer to be polished;
   applying an RL-based slurry to said exposed layer;
   said RL-based slurry adapted to polish said layers preponderantly by interaction of particles with said layers, said slurry consisting of:
      particulate matter having a concentration in said RL-based slurry in the range of from 50 PPM to 450 PPM and a particle diameter size centered at substantially 100 nm, with a diameter variation in the range of plus/minus 80 nm, and with substantially no particle diameter exceeding 180 nm; and
   terminating the application of said RL-based slurry when a desired degree of removal of said metallic material and said dielectric material has been reached for a one of said layers.

2. The process in accordance with claim 1, wherein said metallic material is copper and said dielectric material is low-k dielectric.

3. The process in accordance with claim 2, further comprising means for varying said concentration of said particles in said RL-based slurry to any point within said range of from 50 PPM to 450 PPM thereby to vary material removal rate at a selected point in said chemical-mechanical planarization.

4. The process in accordance with claim 2, further comprising means for varying the rate of flow of said RL-based slurry, thereby to vary material removal rate at a selected point in said chemical-mechanical planarization.

5. A process for the formation of semiconductor wafers, wherein said wafers comprise a plurality of layers, each said layer comprising a metallic material and a dielectric material, said process comprising the steps of:

provticing a chemical-mechanical planarization wafer polishing station;

providing to said station a plurality of semiconductor wafers, applying an RL-based slurry to a one of said layers in said wafers;

said RL-based slurry adapted to polish said layers preponderantly by interaction of particles with said layers, said slurry consisting of dibasic ammonium citrate, hydrogen peroxide, and triazole;

said slurry further consisting of particulate matter having a concentration in said RL-based slurry in the range of from 50 PPM to 450 PPM and a particle diameter size centered at substantially 100 nm, with a diameter variation in the range of plus/minus 80 nm, and with substantially no particle diameter exceeding 180 nm; and terminating the application of said slurry when a desired degree of removal of said metallic material and said dielectric material has been reached for a one of said layers.

6. The process in accordance with claim 5, wherein said triazole is at a concentration of substantially 0.85 wt % in said slurry.

7. The process in accordance with claim 6, wherein said particulate matter is selected from the group consisting of colloidal silica, fumed silica, alumina, ceria, and diamond.

8. The process of claim 7, wherein said particulate matter is colloidal silica.

9. The process of claim 8 wherein the pH level of said RL slurry is centered at substantially pH5.

10. The process of claim 9, wherein said metallic material is copper and said dielectric material is a low-k dielectric.

11. The process of claim 10, further comprising means for varying said concentration of said particles in said slurry to any point within said range of from 50 PPM to 450 PPM thereby to vary material removal rate at a selected point in said chemical-mechanical planarization.

12. The process of claim 11, further comprising means for varying the rate of flow of said RL-based slurry, thereby to vary material removal rate at a selected point in said chemical-mechanical planarization.

* * * * *